United States Patent
Lee et al.

(10) Patent No.: US 10,995,268 B2
(45) Date of Patent: May 4, 2021

(54) ETCHING COMPOSITION EFFECTIVE TO SELECTIVELY WET ETCH A SILICON NITRIDE FILM

(71) Applicant: LTCAM CO., LTD., Pyeongtaek-si (KR)

(72) Inventors: Sok Ho Lee, Yongin-si (KR); Jung Hwan Song, Seoul (KR); Seong Sik Jeon, Suwon-si (KR); Sung Il Jo, Daejeon (KR); Byeoung Tak Kim, Incheon (KR); Ah Hyeon Lim, Daejeon (KR); Junwoo Lee, Jeollabuk-do (KR)

(73) Assignee: LTCAM CO., LTD., Pyeongtaek-si (KR)

( * ) Notice: Subject to any disclaimer, the term of this patent is extended or adjusted under 35 U.S.C. 154(b) by 90 days.

(21) Appl. No.: 16/425,333

(22) Filed: May 29, 2019

(65) Prior Publication Data
US 2019/0367811 A1    Dec. 5, 2019

(30) Foreign Application Priority Data

May 31, 2018 (KR) .......... 10-2018-0062247

(51) Int. Cl.
| | | |
|---|---|---|
| *C09K 13/06* | (2006.01) | |
| *H01L 21/02* | (2006.01) | |
| *H01L 21/311* | (2006.01) | |
| *C09K 13/04* | (2006.01) | |

(52) U.S. Cl.
CPC .......... *C09K 13/06* (2013.01); *H01L 21/0217* (2013.01); *H01L 21/31111* (2013.01); *C09K 13/04* (2013.01)

(58) Field of Classification Search
CPC ..... C09K 13/06; C09K 13/04; H01L 21/0217; H01L 21/31111; C09G 1/00; C23F 1/10

USPC .... 252/79.1, 79.2, 79.3, 79.4; 216/103, 106, 216/107
See application file for complete search history.

(56) References Cited

U.S. PATENT DOCUMENTS

| | | | | |
|---|---|---|---|---|
| 2007/0077353 A1* | 4/2007 | Lee | ............... | H01L 21/76814 427/248.1 |
| 2008/0203060 A1* | 8/2008 | Hara | ............... | H01L 21/31111 216/99 |
| 2015/0348799 A1* | 12/2015 | Hong | ............... | H01L 29/66825 438/268 |
| 2016/0017224 A1* | 1/2016 | Lee | ............... | H01L 21/0214 438/706 |

FOREIGN PATENT DOCUMENTS

| | | |
|---|---|---|
| JP | H09-45660 A | 2/1997 |
| KR | 10-1097275 B1 | 12/2011 |
| KR | 10-1539375 B1 | 7/2015 |
| KR | 10-2016-0010267 A | 1/2016 |
| KR | 10-1730453 B1 | 4/2017 |
| KR | 10-1730454 B1 | 4/2017 |

* cited by examiner

*Primary Examiner* — Lan Vinh
(74) *Attorney, Agent, or Firm* — Rabin & Berdo, P.C.

(57) ABSTRACT

A silicon nitride etching composition effective to selectively etch a silicon nitride film contains an inorganic acid; a silicon-based compound; from 0.01 to 1 wt%, based on total weight of the etching composition, of an ammonium-based compound composed of ammonium acetic acid; and water. The silicon-based compound may be represented by Chemical Formula 1 below or Chemical Formula 2 below, $(R1)_3$-Si-R2-Si-$(R1)_3$      Chemical Formula 1, $(R3)_3$-Si-R4-Si-$(R3)_3$      Chemicl Formula 2.

A method of etching a silicon nitride film includes providing the etching composition; and wet etching the silicon nitride film in the etching composition at an etching rate that is at least 200 times faster than a corresponding silicon oxide film.

9 Claims, No Drawings

ETCHING COMPOSITION EFFECTIVE TO SELECTIVELY WET ETCH A SILICON NITRIDE FILM

CROSS-REFERENCE TO RELATED APPLICATIONS

The present disclosure claims priority to Korean Patent Application No. 10-2018-0062247 in the Republic of Korea, the disclosures of which are incorporated herein by reference.

BACKGROUND

1. Field of the Disclosure

The present disclosure relates to an etchant composition for a silicon nitride film, and more particularly, to an etchant composition with a high selectivity to a silicon nitride film, which is used to etch away a silicon nitride film in semiconductor process and which selectively has a higher etching rate of the silicon nitride film compared to a silicon oxide film in a high temperature etching process.

2. Description of the Related Art

The semiconductor manufacturing process requires a stack structure forming technique capable of continuously increasing an integration density through an introduction of a three-dimensional structure. In the semiconductor manufacturing process, a silicon oxide film ($SiO_2$) and a silicon nitride film ($SiN_x$), which are representative insulating films, are stacked individually or stacked into one or more films in an alternate sequence and used, and such oxide film and the nitride film are also used as a hard mask for forming a conductive pattern such as a metal wiring. The silicon nitride film and the silicon oxide film are the main insulating films that form a stack structure for forming a three-dimensional NAND flash memory gate.

In order to form the stack structure, the silicon nitride film may be removed by wet etching process that uses an etchant or etchant composition containing phosphoric acid, for example. Further, depending on need for forming various patterns included in the semiconductor device, a process of selectively etching the silicon nitride film may be required. The etchant composition with a high selectivity is required for selective etching of the silicon nitride film over a silicon oxide film.

Korean Patent Application Publication No. 10-2005-0003163 discloses an etchant including phosphoric acid and hydrofluoric acid for a nitride film of a semiconductor device. However, when hydrofluoric acid is included in the etchant, this will cause removal of the silicon oxide film too, in which case it is not possible to ensure a sufficient etch selectivity to the nitride film over the oxide film, and there is a problem that the etchant can not be used in a pattern with a highly stacked structure, due to damage to the silicon oxide film, collapse of the pattern, re-growth of the silicon oxide film, and the like.

In addition, in the wet etching process for removing the nitride film, a mixture of phosphoric acid and deionized water is generally used. Deionized water is added to prevent decrease in the etching rate and change of the etching selectivity to the oxide film, but there is a problem that even a slight change in the amount of deionized water causes defects in the process of etching away the nitride film. In order to solve this problem, a technique is disclosed in Korea Registered Patent No. 10-1730453, which removes a nitride film by using an etchant composition that further contains hydrofluoric acid, nitric acid, and the like in addition to phosphoric acid, but it results in decreased etch selectivity of the nitride film and the oxide film.

Korea Registered Patent No. 10-1097275 discloses a composition for etching the silicon nitride film, which further contains oxime silane in addition to phosphoric acid. However, since the composition has low solubility, there is a problem that particles are adsorbed and generated on a semiconductor substrate or the silicon oxide film.

In order to solve these problems, in the related art, a technique for increasing the selective etching rate by using an additive to suppress etching of the silicon oxide film, for example, a silicon oxide film etching inhibitor such as silicate, fluorosilicic acid, fluorosilicate or the like, or a silicon nitride film etching enhancer has been studied, and Korea Registered Patent No. 10-1730454 discloses an etchant composition containing phosphoric acid, a silicon-fluorine compound containing a silicon-fluorine bond, a sulfonylimide-based adsorption inhibitor, a polymer-based adsorption inhibitor, and water as a nitride-based etchant composition. However, there is a problem that the additive increases the silicon concentration in the composition and the silicon oxide film re-grows over the process time.

PRIOR ART DOCUMENTS

Patent Literature (Patent Document 1) Japanese Laid-Open Publication No. 1997-045660
(Patent Document 2) Korea Registered Patent No. 10-1730453
(Patent Document 3) Korea Registered Patent No. 10-1097275
(Patent Document 4) Korea Registered Patent No. 10-1730454

SUMMARY

An object of the present disclosure is to provide an etchant composition which is capable of minimizing an etching rate of a silicon oxide film in a selective removal of a silicon nitride film and which does not have problems such as generation of particles on a surface of the silicon oxide film, undesired removal of the silicon nitride film, and the like.

The composition for etching according to an embodiment of the present disclosure contains an inorganic acid, a silicon-based compound represented by Chemical Formula 1, and water, and does not contain fluorine:

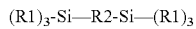   [Chemical Formula 1]

where, R1 is independently a hydrogen atom, a hydroxy group, a C1-C10 alkyl group or a C1-C10 alkoxy group, at least two of six R1 are a hydroxy group or a C1-C10 alkoxy group, and R2 is a C2-C10 alkylene group which may be substituted, the substitution includes a substitution of one H or at least one H contained in the functional group with a substituent, and the substituent may include a substituent selected from the group consisting of a benzyl group, a biphenyl group, an amine group, a disulfide group, and a combination thereof.

The inorganic acid may be any one selected from the group consisting of sulfuric acid, nitric acid, phosphoric acid, and a mixture thereof. The amount of the silicon-based compound may be 0.005 to 1 wt % of the total weight of the mixture.

The composition for etching may further contain 0.01 to 1 wt % of an ammonium-based compound based on the total weight of the composition for etching, and the ammonium-based compound may be any one selected from the group consisting of ammonia water, ammonium acetic acid, and a mixture thereof.

The composition for etching is effective in inhibiting etching of the silicon oxide film at a temperature of 120° C. to 190° C., and has an etching rate of the silicon nitride film at least 200 times faster than an etching rate of the silicon oxide film at 160° C.

The composition for etching according to another embodiment of the present disclosure contains an inorganic acid, a silicon-based product resulting from a reaction of the compound of Chemical Formula 2 with phosphoric acid in an anhydrous state at 170° C. to 220° C., and water, and does not contain fluorine.

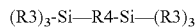  [Chemical Formula 2]

where, R3 is independently a hydrogen atom, a halogen atom, a hydroxy group, a C1-C6 alkyl group or a C1-C6 alkoxy group, at least two of six R3 are a halogen atom, a hydroxy group or a C1-C6 alkoxy group, and R4 is a C2-C10 alkylene group which may be substituted, the substitution includes a substitution of one H or at least one H contained in the functional group with a substituent, and the substituent may include a substituent selected from the group consisting of a benzyl group, a biphenyl group, an amine group, a disulfide group, and a combination thereof.

The inorganic acid may be any one selected from the group consisting of sulfuric acid, nitric acid, phosphoric acid, and a mixture thereof. The amount of the silicon-based product may be 0.005 to 1 wt % of the total weight of the mixture. The composition for etching may further contain 0.01 to 1 wt % of an ammonium-based compound based on the total weight of the composition for etching, and the ammonium-based compound may be any one selected from the group consisting of ammonia water, ammonium acetic acid, and a mixture thereof.

The composition for etching is effective in preventing etching of the silicon oxide film at a temperature of 120° C. to 190° C., and may have an etching rate of the silicon nitride film at least 200 times faster than an etching rate of the silicon oxide film at 160° C.

The composition for etching according to the present disclosure has a high etching selectivity of the silicon nitride film to the silicon oxide film. In addition, because the etching rate of the silicon oxide film can be controlled and the selectivity to the under layer such as polysilicon is also excellent, a wide range of applications are allowed in the semiconductor manufacturing process, and the problems of particle adsorption on the surface of the silicon oxide film and undesired removal of the silicon nitride film can be improved.

DETAILED DESCRIPTION

An embodiment of the present disclosure relates to an etchant composition containing phosphoric acid, a silicon-based compound, and water, and not containing fluorine, and capable of selectively etching a silicon nitride film while inhibiting damage to the underlying metal film and the like and etching of the silicon oxide film.

More particularly, the embodiment relates to a selective silicon nitride film etchant composition capable of selectively wet etching a silicon nitride film in a manufacturing process of semiconductor, dynamic random-access memory (DRAM) and NAND flash memory, in which the composition has at least 200 higher etching selectivity.

Hereinafter, specific embodiments of the present disclosure will be described. However, this is merely an example and the present disclosure is not limited thereto.

The inorganic acid is any one selected from the group consisting of sulfuric acid, nitric acid, phosphoric acid, and a mixture thereof. Preferably, the inorganic acid may be phosphoric acid. The phosphoric acid is the most preferable for securing the etching selectivity and etching rate of the silicon nitride film, and can be mixed with other inorganic acids and used for adjusting the selectivity of the silicon nitride film and the silicon oxide film. The content of the inorganic acid in the composition is preferably 80 to 90 wt % based on the total weight of the etchant composition. When the content is lower than 80 wt %, there is a problem that the etching rate of the silicon nitride film is low, and when it is higher than 90 wt %, a high selectivity of the silicon nitride film to the silicon oxide film can not be obtained.

The silicon-based compound has a structure represented by Chemical Formula 1 as follows.

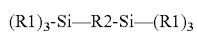  [Chemical Formula 1]

In Chemical Formula 1, R1 is independently a hydrogen atom, a hydroxy group, a C1-C10 alkyl group or a C1-C10 alkoxy group, at least two of six R1 are a hydroxy group or a C1-C10 alkoxy group and R2 is a C2-C10 alkylene group which may be substituted, the substitution includes a substitution of one H or at least one H contained in the functional group with a substituent, and the substituent may include a substituent selected from the group consisting of a benzyl group, a biphenyl group, an amine group, a disulfide group, and a combination thereof.

Specifically, the silicon-based compound represented by Chemical Formula 1 may be a hydroxysilane or an alkoxysilane compound.

The hydroxysilane compound may be any one selected from the group consisting of bistrihydroxysilylethane, bisdimethylhydroxysilylethane, bismethyldihydroxysilylethane, bisdihydroxysilylethane, bishydroxysilylethane, bistrihydroxysilyloctane, bisdimethyl hydroxysilyloctane, bismethyl dihydroxysilyloctane, bisdihydroxysilyloctane, bishydroxysilyloctane, bistrihydroxysilylbenzene, bisdimethylhydroxysilylbenzene, bismethyldihydroxysilylbenzene, bisdihydroxysilylbenzene, bishydroxysilylbenzene, bistrihydroxysilylbiphenyl, bisdimethylhydroxysilylbiphenyl, bismethyldihydroxysilylbiphenyl, bisdihydroxysilylbiphenyl, bishydroxysilylbiphenyl, bistrihydroxysilylpropyl amine, bisdimethylhydroxysilylpropyl amine, bismethyldihydroxysilylpropylamine, bisdihydroxysilylprophylamine, bishydroxysilylpropylamine, bistrihydroxysilylpropyl disulfide, bisdimethylhydroxysilylpropyl disulfide, bismethyldihydroxysilylpropyl disulfide, bisdihydroxysilylpropyl disulfide, bishydroxysilylpropyl disulfide, and a mixture thereof.

The alkoxysilane compound may be any one selected from the group consisting of bistrimethoxysilylethane, bisdimethylmethoxysilylethane, bismethyldimethoxysilylethane, bisdiethylmethoxysilylethane, bisethyldimethoxysilylethane, bistriethoxysilylethane, bisdimethylethoxysilylethane, bismethyldiethoxysilylethane, bisdiethylethoxysilylethane, bisethyldiethoxysilylethane, bistrimethoxysilyloctane, bisdimethylmethoxysilyloctane, bismethyldimethoxysilyloctane, bisdiethylmethoxysilyloctane, bisethyldimethoxysilyloctane, bistriethoxysilyloctane, bisdimethylethoxysilyloctane, bismethyldiethoxysilyloctane, bisdiethylethoxysilyloctane, bisethyldiethoxysilyloctane, bistrimethoxysilylbenzene, bisdimethylmethoxysilylbenzene, bismethyldimethoxysilylbenzene, bisdiethylmethoxysilylbenzene, bisethyldimethoxysilylbenzene, bistriethoxysilylbenzene, bisdimethylethoxysilylbenzene, bismethyldiethoxysilylbenzene, bisdiethylethoxysilylbenzene, bisethyldiethoxysilylbenzene, bistrimethoxysilylbiphenyl, bisdimethylmethoxysilylbiphenyl, bismethyldimethoxysilylbiphenyl, bisdiethylmethoxysilylbiphenyl, bisethyldimethoxysilylbiphenyl, bistriethoxysilylbiphenyl, bisdimethylethoxysilylbiphenyl, bismethyldiethoxysilylbiphenyl, bisdiethylethoxysilylbiphenyl, bisethyldiethoxysilylbiphenyl, bistrimethoxysilylpropyl amine, bisdimethylmethoxysilylpropyl amine, bismethyldimethoxysilylpropyl amine, bisdiethylmethoxysilylpropyl amine, bisethyldimethoxysilylpropylamine, bistriethoxysilylpropylamine, bisdimethylethoxysilylpropylamine, bismethyldiethoxysilylpropylamine, bisdiethylethoxysilylpropylamine, bisethyldiethoxysilylpropylamine, bistrimethoxysilylpropyl disulfide, bisdimethylmethoxysilylpropyl disulfide, bismethyldimethoxysilylpropyl disulfide, bisdiethylmethoxysilylpropyl disulfide, bisethyldimethoxysilylpropyl disulfide, bistriethoxysilylpropyl disulfide, bisdimethylethoxysilylpropyl disulfide, bismethyldiethoxysilylpropyl disulfide, bisdiethylethoxysilylpropyl disulfide, bisethyldiethoxysilylpropyl disulfide, and a mixture thereof.

The content of the silicon-based compound is not particularly limited, but may be in a range of 0.005 to 1 wt % of the total weight of the mixture. When the content is lower than 0.005 wt %, the anti-etching effect on the silicon oxide film is deteriorated, and when it is higher than 1 wt %, the improvement in the selectivity to the silicon nitride film and the silicon oxide film is reduced, and problem such as etching failure of the silicon nitride film or particles remaining on the surface of the silicon oxide film may occur.

The composition for etching may further contain 0.01 to 1 wt % of an ammonium-based compound based on the total weight of the composition for etching. The ammonium-based compound may be selected from the group consisting of ammonia water, ammonium acetic acid, and a mixture thereof. The ammonium-based compound is known to uniformly etch the silicon nitride film over time. When the ammonium-based compound is added at an amount lower than 0.01 wt %, the effect of maintaining the selectivity may be insufficient, and when added at an amount higher than 1 wt %, the etching rate of the silicon nitride film may be lowered.

The composition for etching is effective in preventing etching of the silicon oxide film at a temperature of 120° C. to 190° C., and may have an etching rate of the silicon nitride film at least 200 times faster than an etching rate of the silicon oxide film at 160° C.

The composition for etching according to another embodiment of the present disclosure contains an inorganic acid, a silicon-based product resulting from a reaction of the compound of Chemical Formula 2 with phosphoric acid in an anhydrous state at 170° C. to 220° C., and water, and does not contain fluorine.

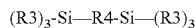—Si— [Chemical Formula 2]

(R3)$_3$-Si—R4-Si—(R3)$_3$ [Chemical Formula 2]

In Chemical Formula 2, R3 is independently a hydrogen atom, a halogen atom, a hydroxy group, a C1-C6 alkyl group or a C1-C6 alkoxy group, at least two of six R3 are a halogen atom, a hydroxy group or a C1-C6 alkoxy group, and R4 is a C2-C10 alkylene group which may be substituted, the substitution includes a substitution of one H or at least one H contained in the functional group with a substituent, and the substituent may include a substituent selected from the group consisting of a benzyl group, a biphenyl group, an amine group, a disulfide group, and a combination thereof.

A composition for etching according to another embodiment of the present disclosure contains an inorganic acid, a silicon-based product resulting from a reaction of the compound represented by Chemical Formula 2 with phosphoric acid in an anhydrous state, and water. The inorganic acid may be any one selected from the group consisting of sulfuric acid, nitric acid, phosphoric acid, and a mixture thereof. Preferably, the inorganic acid may be phosphoric acid, and the composition for etching may further contain sulfuric acid as an additive. The phosphoric acid is the most preferable for securing the etching selectivity and etching rate of the silicon nitride film, and can be mixed with other inorganic acids and used for adjusting the selectivity of the silicon nitride film and the silicon oxide film. The content of the inorganic acid in the composition is preferably 80 to 90 wt %. When the content is lower than 80 wt %, there is a problem that the etching rate to the nitride film is low, and when it is higher than 90 wt %, a high selectivity of the silicon nitride film to the silicon oxide film can not be obtained.

Specifically, the compound represented by Chemical Formula 2 may be halosilane or alkoxysilane compound.

The halosilane compound is iodosilanes, bromosilanes, chlorosilanes and fluorosilanes. Specifically, the halosilane compound may be any one selected from the group consisting of dichlorosilane, methyl dichlorosilane, ethyl dichlorosilane, ethyl diiodosilane, ethyl difluorosilane, dichloro monofluorosilane, propyl dibromosilane, isopropyl dichlorosilane, isobutyl dichlorosilane, isoamyl dichlorosilane, benzyl dichlorosilane, propenyl dichlorosilane, naphthyl dichlorosilane, phenyl dichlorosilane, diphenyl chlorosilane, methyl ethyl chlorosilane, vinyl methyl chlorosilane, phenyl methyl chlorosilane, dibenzyl chlorosilane, p-chlorophenylmethyl chlorosilane, n-hexyl dichlorosilane, cyclohexyl dichlorosilane, dicyclohexyl chlorosilane, di-isobutyl chlorosilane, p-tolyl dichlorosilane, di-p-tolyl chlorosilane, p-styryl dichlorosilane, ethynyl dichlorosilane, and a mixture thereof.

The alkoxysilane compound may be any one selected from the group consisting of bistrimethoxysilylethane, bisdimethylmethoxysilylethane, bismethyldimethoxysilylethane, bisdiethylmethoxysilylethane, bisethyldimethoxysilylethane, bistriethoxysilylethane, bisdimethylethoxysilylethane, bismethyldiethoxysilylethane, bisdiethylethoxysilylethane, bisethyldiethoxysilylethane, bistrimethoxysilyloctane, bisdimethylmethoxysilyloctane, bismethyldimethoxysilyloctane, bisdiethylmethoxysilyloctane, bisethyldimethoxysilyloctane, bistriethoxysilyloctane, bisdimethylethoxysilyloctane, bismethyldiethoxysilyloctane, bisdiethylethoxysilyloctane, bisethyldiethoxysilyloctane, bistrimethoxysilylbenzene, bisdimethylmethoxysilylbenzene, bismethyldimethoxysilylbenzene, bisdiethylmethoxysilylbenzene, bisethyldimethoxysilylbenzene, bistriethoxysilylbenzene, bisdimethylethoxysilylbenzene, bismethyldiethoxysilylbenzene, bisdiethylethoxysilylbenzene, bisethyldiethoxysilylbenzene, bistrimethoxysilylbiphenyl, bisdimethylmethoxysilylbiphenyl, bismethyldimethoxysilylbiphenyl, bisdiethylmethoxysilylbiphenyl, bisethyldimethoxysilylbiphenyl, bistriethoxysilylbiphenyl, bisdimethylethoxysilylbiphenyl, bismethyldiethoxysilylbiphenyl, bisdiethylethoxysilylbiphenyl, bisethyldiethoxysilylbiphenyl, bistrimethoxysilylpropyl amine, bisdimethylmethoxysilylpropyl amine, bismethyldimethoxysilylpropyl amine, bisdiethylmethoxysilylpropyl amine, bisethyldimethoxysilylpropylamine, bistriethoxysilylpropylamine, bisdimethylethoxysilylpropylamine, bismethyldiethoxysilylpropylamine, bisdiethylethoxysilylpropylamine, bisethyldiethoxysilylpropylamine, bistrimethoxysilylpropyl disulfide, bisdimethylmethoxysilylpropyl disulfide, bismethyldimethoxysilylpropyl disulfide, bisdiethylmethoxysilylpropyl disulfide, bisethyldimethoxysilylpropyl disulfide, bistriethoxysilylpropyl disulfide, bisdimethylethoxysilylpropyl disulfide, bismethyldiethoxysilylpropyl disulfide, bisdiethylethoxysilylpropyl disulfide, bisethyldiethoxysilylpropyl disulfide, and a mixture thereof.

The silicon-based product is prepared by reacting phosphoric anhydride with the compound of Chemical Formula 2. The silicon-based product is prepared by adding the compound of Chemical Formula 2 to phosphoric anhydride and then allowing a reaction to occur at 170° C. to 220° C. In addition, when the compound of Chemical Formula 2 is chlorosilane, a process of removing hydrochloric acid is further required, and when the compound is alkoxysilane, a process of removing alkyl alcohol is further required. When the reaction temperature is lower than 170° C., the reaction proceeds slowly to result in a lower yield, and when the reaction temperature is equal to or higher than 220° C., the reaction between phosphoric acids may occur rapidly.

The content of the silicon-based product is not particularly limited, but may be in a range of 0.005 to 1 wt % of the total weight of the mixture. When the content is lower than 0.005 wt %, the anti-etching effect on the oxide film is deteriorated, and when it is higher than 1 wt %, the improvement in the selectivity to the silicon nitride film and the silicon oxide film is reduced, and problem such as etching failure of the silicon nitride film or particles remaining on the surface of the silicon oxide film may occur.

The composition for etching may further contain 0.01 to 1 wt % of an ammonium-based compound based on the total weight of the composition for etching. The ammonium-based compound may be selected from the group consisting of ammonia water, ammonium acetic acid, and a mixture thereof. The ammonium-based compound is known to uniformly etch the silicon nitride film over time. When the ammonium-based compound is added at an amount lower than 0.01 wt %, the effect may be insufficient, and when added at an amount higher than 1 wt %, the etching rate of the silicon nitride film may be lowered.

The silicon-based product is effective in inhibiting etching of the silicon oxide film at a temperature of 120° C. to 190° C., and may have an etching rate of the silicon nitride film at least 200 times faster than an etching rate of the silicon oxide film at 160° C.

Hereinafter, while the preferred embodiments and experimental examples are presented to facilitate understanding of the present disclosure, these embodiments and experimental examples are illustrative of the present disclosure and are not intended to limit the scope of the appended claims, and various changes and modifications may be made to the embodiments and experimental examples without departing from the scope and spirit of the present disclosure.

Preparation of Etchant Composition

The composition was prepared by adding components to each experimental beaker equipped with a magnetic bar at a composition ratio shown in Table 1, and then stirring at a speed of 500 rpm for 10 minutes at room temperature.

Evaluation of Etching Rate and Selectivity of Etchant Composition

Measurement of Etching Rate of Silicon Oxide Film and Silicon Nitride Film

In order to measure the performance of the etching solutions prepared in the above examples and comparative examples, a silicon nitride film wafer and a silicon oxide film wafer were prepared by depositing by using the CVD method in the same manner as the semiconductor manufacturing process. Before etching was started, the thickness before etching was measured using a scanning electron microscope and an ellipsometer. Thereafter, the coupons of the wafers of the silicon oxide film and the silicon nitride film were immersed in an etching solution maintained at 160° C. in a quartz stirring tank stirred at a speed of 500 rpm, to carry out the etching process, and after the etching was completed, the coupons were cleansed with ultrapure water, and then the residual etchant and moisture were completely dried using a drying apparatus. After the etching, the thin film thickness of the dried coupons of the wafers were measured using a scanning electron microscope and an ellipsometer. Accordingly, the etching rate was measured with the thin film thicknesses before and after etching. The etching amount and the etching rate as used herein refer to the reduction amount and reduction rate of the thin film thickness before and after the etching, respectively. The etching selectivity (etching rate of silicon nitride film/ etching rate of silicon oxide film) as used herein refers to the ratio of the etching rate of the silicon nitride film to the etching rate of the silicon oxide film:

$$\frac{A}{B} = C$$

[A: etching rate of silicon nitride film, B: etching rate of silicon oxide film, C: selectivity]

TABLE 1

| | Composition | | | | | | Etch rate (Å/min) | | |
| | Inorganic acid | | Additive | | Water | | Nitride Film | Oxide Film | Selectivity |
| | Component | Content | Component | Content | Component | Content | | | |
|---|---|---|---|---|---|---|---|---|---|
| Ex. 1 | A-1 | 85 | B-1 | 0.01 | C-1 | Residual | 93.5 | 0.2 | 468 |
| Ex. 2 | A-1 | 85 | B-1 | 0.05 | C-1 | Residual | 92.4 | 0.1 | 924 |
| Ex. 3 | A-1 | 85 | B-1 | 0.1 | C-1 | Residual | 89.4 | 0.1 | 894 |
| Ex. 4 | A-1 | 85 | B-2 | 0.05 | C-1 | Residual | 90.4 | 0.1 | 904 |
| Ex. 5 | A-1 | 85 | B-3 | 0.01 | C-1 | Residual | 92.3 | 0.3 | 308 |
| Ex. 6 | A-1 | 85 | B-3 | 0.05 | C-1 | Residual | 91.8 | 0.2 | 459 |

TABLE 1-continued

| | Composition | | | | | | Etch rate (Å/min) | | |
|---|---|---|---|---|---|---|---|---|---|
| | Inorganic acid | | Additive | | Water | | Nitride | Oxide | |
| | Component | Content | Component | Content | Component | Content | Film | Film | Selectivity |
| Ex. 7 | A-1 | 85 | B-3 | 0.1 | C-1 | Residual | 91.5 | 0.1 | 915 |
| Ex. 8 | A-1 | 85 | B-3 | 0.5 | C-1 | Residual | 90.8 | 0.1 | 908 |
| Ex. 9 | A-1 | 85 | B-4 | 0.2 | C-1 | Residual | 91.6 | 0.2 | 458 |
| Ex. 10 | A-1 | 85 | B-5 | 0.05 | C-1 | Residual | 91.8 | 0.3 | 306 |
| Ex. 11 | A-1 | 85 | B-6 | 0.3 | C-1 | Residual | 90.9 | 0.2 | 455 |
| Ex. 12 | A-1 | 85 | B-7 | 0.1 | C-1 | Residual | 91.5 | 0.2 | 458 |
| Ex. 13 | A-1 | 85 | B-8 | 0.5 | C-1 | Residual | 91.3 | 0.1 | 913 |
| Comp. Ex. 1 | A-1 | 85 | — | — | C-1 | Residual | 94.5 | 2.2 | 43 |
| Comp. Ex. 2 | A-1 | 85 | B-3 | 0.001 | C-1 | Residual | 92.5 | 0.9 | 103 |
| Comp. Ex. 3 | A-1 | 85 | B-3 | 10 | C-1 | Residual | 20.3 | 0.2 | 102 |
| Comp. Ex. 4 | A-1 | 85 | B-9 | 0.1 | C-1 | Residual | 90.3 | 1.4 | 65 |
| Comp. Ex. 5 | A-1 | 85 | B-10 | 0.5 | C-1 | Residual | 90.8 | 1.1 | 83 |

A-1: phosphoric acid
B-1: bistriethoxysilylethane
B-2: bistriethoxysilyloctane
B-3: product of bistrichlorylsilaneethane and phosphoric anhydride
B-4: product of bismethyldichlorosilylethane and phosphoric anhydride
B-5: product of bistriethoxysilylethane and phosphoric anhydride
B-6: product of bistrichlorylsilyloctane and phosphoric anhydride
B-7: product of bismethyldichlorosilyloctane and phosphoric anhydride
B-8: product of bistriethoxysilyloctane and phosphoric anhydride
B-9: methyltrihydroxysilane
B-10: methyltrimethoxysilane
C-1: deionized water Referring to Table 1 above, it can be seen that the etchant composition of Examples 1 to 13 has a superior selective etching rate of a silicon nitride film to a silicon oxide film, which is achieved through etching inhibition of the silicon oxide film.

INDUSTRIAL APPLICABILITY

The composition for etching according to the present disclosure has a high etching selectivity of the silicon nitride film to the silicon oxide film. In addition, because the etching rate of the silicon oxide film can be controlled and the selectivity to the under layer such as polysilicon is also excellent, a wide range of applications are allowed in the semiconductor manufacturing process, and the problems such as particle adsorption on the surface of the silicon oxide film, undesired removal of the silicon nitride film, and so on can be improved.

What is claimed is:
1. A silicon nitride etching composition effective to selectively wet etch a silicon nitride film, consisting of:
an inorganic acid;
a silicon-based compound represented by Chemical Formula 1 below;
from 0.01 to 1 wt%, based on total weight of the etching composition, of an ammonium-based compound consisting of ammonium acetic acid; and
water,

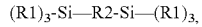   Chemical Formula 1 where R1 is independently a hydrogen atom, a hydroxy group, a C1-C10 alkyl group or a C1-C10 alkoxy group, and at least two of six R1 are a hydroxy group or a C1-C10 alkoxy group, and
R2 is a C2-C10 alkylene group which may be substituted by substitution of at least one H contained in the functional group with a substituent selected from the group consisting of a benzyl group, a biphenyl group, an amine group, a disulfide group, and a combination thereof,
wherein the etching composition does not contain fluorine and has a selective etching rate for said silicon nitride film that is at least 200 times faster than an etching rate of a corresponding silicon oxide film.

2. The etching composition according to claim 1, wherein the silicon-based compound is present in an amount ranging from 0.005 to 1 wt% based on total weight of a mixture of the inorganic acid and the silicon-based compound.

3. The etching composition according to claim 1, wherein the inorganic acid is selected from the group consisting of sulfuric acid, nitric acid, phosphoric acid, and a mixture thereof.

4. A silicon nitride etching composition effective to selectively wet etch a silicon nitride film, consisting of:
an inorganic acid;
a silicon-based product obtained by reacting a compound of Chemical Formula 2 below with phosphoric acid in an anhydrous state at 170° C. to 220° C.;
from 0.01 to 1 wt%, based on total weight of the etching composition, of an ammonium-based compound consisting of ammonium acetic acid;
and water,

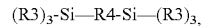   Chemical Formula 2 where R3 is independently a hydrogen atom, a halogen atom, a hydroxy group, a C1-C6 alkyl group or a C1-C6 alkoxy group, and at least two of six R3 are a halogen atom, a hydroxy group or a C1-C6 alkoxy group, and
R4 is a C2-C10 alkylene group which may be substituted by substitution of at least one H contained in the functional group with a substituent selected from the group consisting of a benzyl group, a biphenyl group, an amine group, a disulfide group, and a combination thereof,
wherein the etching composition does not contain fluorine and has a selective etching rate for said silicon nitride film that is at least 200 times faster than an etching rate of a corresponding silicon oxide film.

5. The etching composition according to claim 4, wherein the silicon-based product is present in an amount ranging from 0.005 to 1 wt% of total weight of a mixture of the inorganic acid and the silicon-based compound.

6. The etching composition according to claim 4, wherein the inorganic acid is selected from the group consisting of sulfuric acid, nitric acid, phosphoric acid, and a mixture thereof.

7. A method of wet etching a silicon nitride film, comprising:
 (a) providing an etching composition that does not contain fluorine and that consists of:
  (i) an inorganic acid;
  (ii) a silicon-based compound represented by Chemical Formula 1 below or Chemical Formula 2 below, $$(R1)_3\text{-Si—R2-Si—}(R1)_3, \quad \text{Chemical Formula 1}$$

where R1 is independently a hydrogen atom, a hydroxy group, a C1-C10 alkyl group or a C1-C10 alkoxy group, and at least two of six R1 are a hydroxy group or a C1-C10 alkoxy group, and
  R2 is a C2-C10 alkylene group which may be substituted by substitution of at least one H contained in the functional group with a substituent selected from the group consisting of a benzyl group, a biphenyl group, an amine group, a disulfide group, and a combination thereof, $$(R3)_3\text{-Si—R4-Si—}(R2)_3, \quad \text{Chemical Formula 2}$$

where R3 is independently a hydrogen atom, a halogen atom, a hydroxy group, a C1-C6 alkyl group or a C1-C6 alkoxy group, and at least two of six R3 are a halogen atom, a hydroxy group or a C1-C6 alkoxy group, and
  R4 is a C2-C10 alkylene group which may be substituted by substitution of at least one H contained in the functional group with a substituent selected from the group consisting of a benzyl group, a biphenyl group, an amine group, a disulfide group, and a combination thereof;
  (iii) from 0.01 to 1 wt%, based on total weight of the etching composition, of an ammonium-based compound comprising ammonium acetic acid; and
  (iv) water; and
 (b) wet etching said silicon nitride film in the etching composition at a selective etching rate for the silicon nitride film that is at least 200 times faster than an etching rate of a corresponding silicon oxide film.

8. The method according to claim 7, wherein the silicon-based compound is present in an amount ranging from 0.005 to 1 wt% based on total weight of a mixture of the inorganic acid and the silicon-based compound.

9. The method according to claim 7, wherein the inorganic acid is selected from the group consisting of sulfuric acid, nitric acid, phosphoric acid, and a mixture thereof.

* * * * *